United States Patent

[11] 3,582,725

[72] Inventors Yasuo Matukura; Sho Nakanuma; Toshio Wada, all of Tokyo, Japan

[21] Appl. No. 851,840
[22] Filed Aug. 21, 1969
[45] Patented June 1, 1971

[73] Assignee Nippon Electric Company, Limited Tokyo, Japan

[54] SEMICONDUCTOR INTEGRATED CIRCUIT DEVICE AND THE METHOD OF MANUFACTURING THE SAME
11 Claims, 14 Drawing Figs.

[52] U.S. Cl. .......... 317/235, 29/576, 317/234
[51] Int. Cl. .......... H01l 5/00, H01l 7/02
[50] Field of Search .......... 317/235, 237—241; 29/576

[56] References Cited

UNITED STATES PATENTS

| | | | |
|---|---|---|---|
| 3,226,613 | 12/1965 | Haenichen .......... | 317/234 |
| 3,358,195 | 12/1967 | Onodera .......... | 317/234 |
| 3,473,093 | 10/1969 | Bilaus et al. .......... | 317/235 |
| 3,500,143 | 3/1970 | Lamming .......... | 317/235 |

*Primary Examiner*—James D. Kallam
*Attorney*—Sandoe, Hopgood & Calimafde

ABSTRACT: According to the present invention, there is provided a semiconductor integrated circuit device comprising a semiconductor substrate of a first conductivity type; two opposite conductivity type buried layer regions, both with high impurity-concentration but with different outward diffusion speeds, formed within said substrate, the region with the faster speed surrounding the other; and epitaxial layer of the first conductivity type epitaxially grown over said substrate allowing the impurities of said buried layer regions to outwardly diffuse thereinto; a diffusion region of the second conductivity type formed by diffusing second conductivity type impurities from the surface of said epitaxial layer in alignment with the buried layer of the higher outward diffusion speed; and isolated region of the higher outward diffusion speed; an isolated region of the first conductivity type thereby simultaneously formed on the surface of the buried layer of lower outward diffusion speed and surrounded by the diffusion region; an isolation region comprised of part of the epitaxial layer also simultaneously formed on the substrate surrounding the diffusion regions, and finally, metal wiring film attached to each of the regions. The two regions of the buried layer may be formed by using different impurities or by using different concentrations of the same impurity.

INVENTORS
YASUO MATUKURA
SHO NAKANUMA
TOSHIO WADA

BY Sandoe, Hopgood and Calimafde
ATTORNEYS

INVENTORS
YASUO MATUKURA
SHO NAKANUMA
TOSHIO WADA

BY Sandoe, Hopgood and Calimafde
ATTORNEYS

INVENTORS
YASUO MATUKURA
SHO NAKANUMA
TOSHIO WADA

BY Sandoe, Hopgood and Calimafde
ATTORNEYS

SEMICONDUCTOR INTEGRATED CIRCUIT DEVICE AND THE METHOD OF MANUFACTURING THE SAME

This invention relates to a semiconductor integrated circuit device having a plurality of circuit elements which are formed in a semiconductor layer epitaxially deposited on one major surface of a semiconductor single crystalline substrate, and which are isolated by a PN junction one from another.

BACKGROUND OF THE INVENTION

The conventional semiconductor integrated circuit device employing the PN junction isolation region technique, comprises a highly resistive P-type semiconductor substrate, low resistive N-type buried layers selectively diffused into one major surface of the substrate, and an N-type epitaxially grown layer in which individual semiconductor circuit elements are formed. P-type impurities are diffused from the surface of the N-type epitaxial grown region so that the P-diffused region reaches the P-type substrate surrounding the circuit elements. Thus, each of the N-type regions and the associated N-type buried layers are isolated one from another by the PN junctions formed between the P-diffused regions and the N-thpe expitaxial region. In the actual process of manufacture, after forming the isolation regions, a P-type impurity diffusion is performed for base regions, N-type impurity diffusion is performed for emitters, and finally, the lead-out wiring is formed. In the structure of the conventional integrated circuit, the buried layers of high impurity concentration formed beneath the N-type epitaxial region serve to reduce the series resistance of the individual collector regions and to increase the switching speed of the individual transistors. However, between the collector lead-out portions and the buried layers, the resistance component of he epitaxial layer which serves as the collector region remains high.

Furthermore, the above-mentioned repeated diffusion steps affect the quality of the epitaxial layer and of the surface insulation layer, degrading various vital characteristics of the associated circuit elements. Particularly, the diffusion process for forming the isolation junctions may last for several hours, in order for the diffusion may get through the N-type epitaxial layer. This not only adversely affects the efficiency of manufacture but unavoidably causes defects in the substrate and, particularly, lattice defects in the epitaxial layer. These disadvantages, inherent in the conventional manufacturing method, cause great difficulty in the production of recently developed high performance integrated circuit devices such as the junction-type field effect transistors combined with bipolar transistors.

OBJECTS OF THE INVENTION

An object of this invention is to provide a highly reliable semiconductor integrated circuit device, which can be easily manufactured by a simple manufacturing method.

Another object of the invention is to provide a semiconductor integrated circuit device in which the junction-type field effect transistor and the bipolar transistor are included in a common semiconductor substrate.

Still another object of this invention is to provide a simple manufacturing method in which the diffusion process for forming isolation layers is eliminated and which is adapted to produce integrated circuit devices of simplified structure, high reliability, and excellent performance.

SUMMARY OF THE INVENTION

According to the present invention, there is provided a semiconductor integrated circuit device comprising a semiconductor substrate of a first conductivity-type; two opposite conductivity-type buried layer regions, both with high impurity concentration but with different outward diffusion speeds, formed within said substrate, the region with the faster speed surrounding the other; an epitaxial layer of the first conductivity-type epitaxially grown over said substrate allowing the impurities of said buried layer regions to outwardly diffuse thereinto; a diffusion region of the second conductivity-type formed by diffusing second conductivity-type impurities from the surface of said epitaxial layer in alignment with the buried layer of the higher diffusion speed; an isolated region of the first conductivity-type thereby simultaneously formed on the surface of the buried layer of lower outward diffusion speed and surrounded by the diffusion region; an isolation region comprised of part of the epitaxial layer also simultaneously formed on said the substrate surrounding the diffusion region; and finally, metal wiring film attached to each of the regions. As may be appreciated from the structure of the present device, the buried layers of high-concentration second conductivity-type impurities of high and low diffusion speed can be obtained by the use of two kinds of impurities having different diffusion coefficients from each other or by selectively forming the different impurity-concentration layers. The buried layers and the diffusion layer of the second conductivity-type serves as the collector region, while the isolated region surrounded by the collector region serves as the base region. When a second diffusion region of the second conductivity-type is simultaneously formed with the diffusion region within the base region, the second diffusion region may serve as the emitter region. The undiffused epitaxial layer surrounding each of the collector regions serves as the isolation region. Since only three diffusion steps are performed, first and second steps for the buried layers in the substrate, and a third step for the collector and the emitter regions extending from the surface of the epitaxial layer, the disadvantages involved by repeated diffusion steps are avoided in the present invention.

The structure of the present invention is particularly advantageous when a bipolar transistor and a junction-type field effect transistor are incorporated in a common substrate, because the diffusion step for forming the isolation region in the conventional method may be omitted. Moreover, even the diffusion step for forming base regions can be omitted when only bipolar transistors are formed within the semiconductor integrated device. Also note that the opposite conductivity-type region of high impurity density serves, for a bipolar transistor, to decrease the collector region resistance thus making high speed operation possible and, for a field effect transistor, to effectively expand the depletion layer over the channel region. These contribute to improvements in switching speed and mutual conductance.

BRIEF DESCRIPTION OF THE DRAWINGS

The invention will now be specifically described with reference to the accompanying drawings in which.

DETAILED DESCRIPTION

Figure 1:
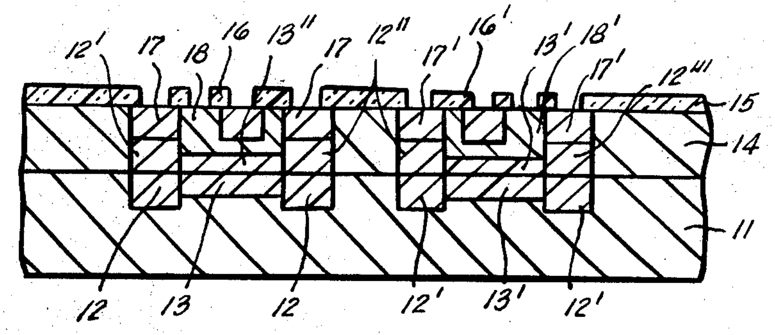
FIG. 1 is a vertical cross-sectional view of a preferred embodiment of the invention.

In FIG. 1, the first embodiment of this invention is shown wherein an integrated circuit device 10 comprises: a silicon single crystal substrate 11 including P-type impurities of a concentration of about $1\times10^{17}/cm^3$; a fist N-type high-impurity-concentrated buried layer 12 containing about $1\times20^{20}/cm^3$ phosphorus atoms as the N-type impurity, layer 12 diffused into the substrate 11 to define a hollow cylindrical region within the substrate; a second N-type buried layer 13 having a surface impurity concentration of about $1\times10^{19}/cm^3$ antimony atoms, layer 13 formed within the substrate 11 in such a manner that it is surrounded and in contact with the first buried layer 12; a p-type silicon epitaxial layer 14 of 3 microns thickness containing $1\times10^{17}/cm^3$ boron, formed by a vapor growth process on the surface of the substrate 11 into which the buried layers 12 and 13 were formed; N-type regions 12'' and 13'' formed by out-diffusion of the N-type impurities of the buried layers 12 and 13, respectively, into the epitaxial layer 14; a silicon dioxide film 15 grown through thermal oxidation on the epitaxial layer 14; an N-type emitter region 16 of a thickness of 1.3 microns with a surface phosphorus concentration of about $1\times10^{20}/cm^3$ diffused into the epitaxial layer 14 through openings in the silicon dioxide film 15; a collector region 17 of the N-type impurity, diffused preferably simultaneously with the emitter region 16, said collector region 17 surface coupled with the N-type out-diffused region 12'' which was out-diffused into the epitaxial layer 14, more deeply than the region 13''; and a base region 18 formed within the epitaxial layer 14 as a result of the formation of the emitter region 16.

In this embodiment, the depth of the out-diffused of the N-type region 12'' (phosphorus-diffused) is about 2.7 microns and that of the buried layer 13 (antimony-diffused) is about 0.7 microns. The emitter region 16 formed through the diffusion process is 1.3 microns deep measured from the surface of the epitaxial layer 14. Therefore, the base region 18 is completely surrounded by the cylindrical collector region consisting of the buried layers 12 and 13, the out-diffused layers 12'' and 13'', and the surface-diffused region 17. This integrated circuit is suited for high speed operation because the collector region has a smaller resistance than integrated circuit devices. Also, since the diffusion steps for forming the isolation region and the base region may be omitted (the isolation region is formed simultaneously with the emitter diffusion process), and since the time needed for the diffusion is very short, contamination of the surface oxide film with impurities for isolation and base regions, which causes noise and other adverse effects in the conventional diffusion processes, is completely avoided.

Furthermore, since the isolation film 15 for protecting the end portions of the PN junction between the collector 17 and the base 18 on the top surface of the epitaxial layer 14 is only expected to protect the layer 14 against emitter diffusion, the thickness of insulation film 15 may be given a sufficient accuracy to facilitate the leading out of the electrodes. Also, more chemically stable films such as silicon nitride or aluminum oxide may be substituted for the silicon oxide and formed through well-known vapor growth, sputtering or the like processes.

Figure 2A:
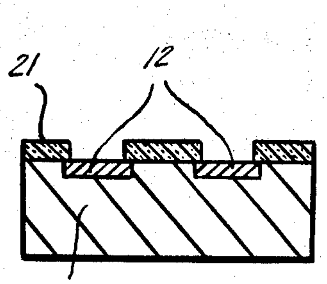
FIGS. 2A through 2E illustrate the process steps of manufacturing the device of FIG. 1.
Figure 2B:
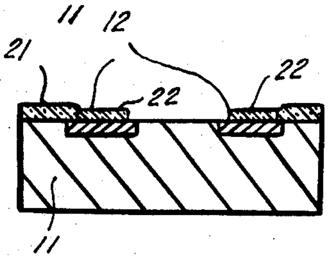
Figure 2C:
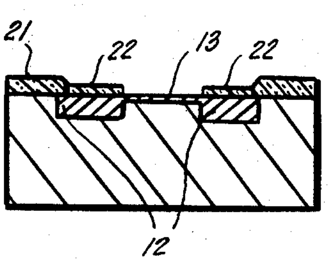
Figure 2D:
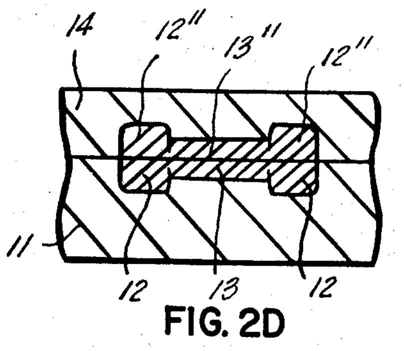
Figure 2E:
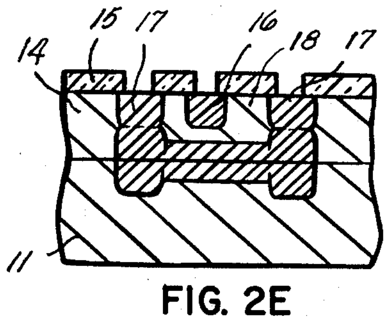

In FIGS. 2A through 2E, showing a preferable manufacturing for the integrated circuit of FIG. 1, part of an oxide film 21 formed on the surface of the P-type silicon substrate 11 through thermal oxidation or vapor growth technique, is formed in a ring-shape. A diffusion buries layer 12 of N-type impurity is formed (FIG. 2A) with a surface impurity concentration of $10^{19}$ to $10^{21}/cm^3$ phosphorus atoms. A second diffusion buried layer 13 is then formed with oxide films 21 and 22 serving as a mask, through thermal oxidation or vapor growth. The layer 13 is formed with a surface impurity concentration of $10^{13}$ to $5\times10^{19}/cm^3$ antimony atoms (FIG. 2B and C). Note carefully that the N-type region 12 including phosphorus impurities of a high diffusion rate is formed in a ring-shape. The second N-type region 13 is located so as to be surrounded by the region 12 and in contact therewith, and has a lower diffusion rate than region 12. After this process, the oxide films 21 and 22 are removed, and an epitaxial layer 14 of 3 microns thickness and of the same conductivity type as the semiconductor substrate 11 is grown same major surface of the semiconductor substrate upon which the buried layers 12 and 13 were formed. While the epitaxial growth is taking place, impurities of the respective buried layers 12 and 13 are out-diffused into the epitaxial layer 14 this forming the second conduction-type regions 12'' and 13'' with thicknesses of 2.7 microns and 0.7 microns respectively (FIG. 2D). Finally, on the top surface of the epitaxial layer 14, the second conductivity-type impurities are diffused through the openings of the insulation film 15. The outer opening pattern of the film 15 corresponds to that of the buried layer 12. The junction depth of the regions formed by the final diffusion becomes 1.3 microns from the surface of the epitaxial layer 14, and thus a base region 18 isolated from other parts of the epitaxial layer 14 is obtained (FIG. 2E).

Figure 3A:
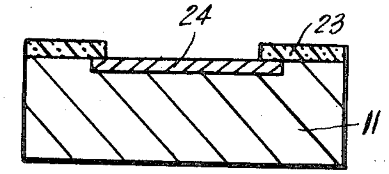
FIGS. 3A through 3F illustrate an alternative method.
Figure 3B:
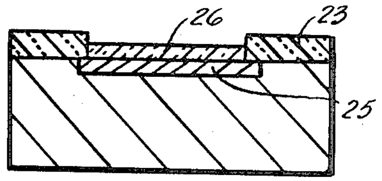
Figure 3C:
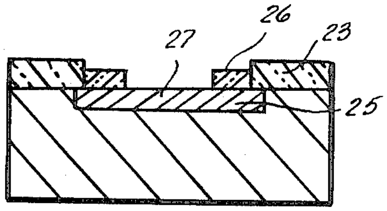
Figure 3D:
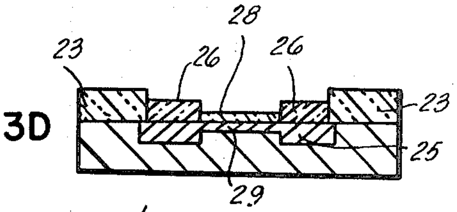
Figure 3E:
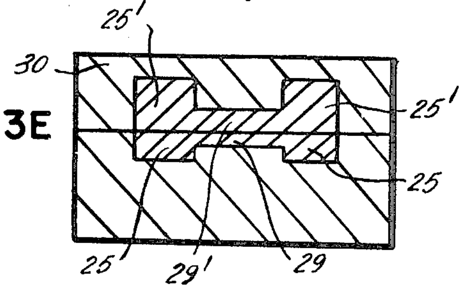
Figure 3F:
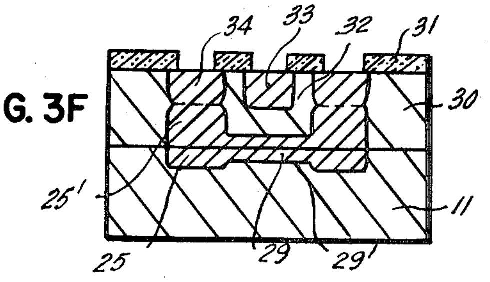

In FIGS. 3A through 3F, an oxide film 23 is formed on the surface of the P-type semiconductor substrate 11 by thermal oxidation or vapor growth. The film 23 is then partially etched away to allow N-type impurities (antimony) 24 to be deposited and diffused. In this diffusion process, the surface impurity concentration becomes $5\times10^{19}$ atoms/$cm^3$ forming an N-type region 25. An oxide film 26 is then formed through thermal oxidation or vapor growth process (FIG. 3B). The layer of film 26 is then removed by hydrochloric anhydride at 1,100° C., or thermally oxidized to provide an opening 27. If the oxidization process is chosen, the substrate 11 and the exposed portion of the N-type region 25 are oxidized, forming an oxide film 28 (FIG. 3D). In any case, the surface impurity concentration of the region 29 located in the center part of the N-type region 25 is decreased. To further decrease the surface density, the step of forming the opening 27 and the thermal oxidation shown in FIGS. 3C and D is repeated. Thus, the surface impurity concentration is caused to be considerably different in the regions 25 and 29. (The surface density of the region 29 may be reduced to $4\times10^7/cm^3$). Next, the oxide films 23, 26 and 28 are all and an epitaxially grown layer 30 including P-type impurities, boron, of $10^{17}/cm^3$ is formed. The layer 30 is treated at a high temperature (1,200° C.) for 16 hours. By this treatment, an N-type out-diffusion region 25' of 1.9 microns thickness is formed on the region 25. The N-type impurities are then diffused within the upper surface of the epitaxial layer 30 through the thermal oxidation or vapor growth processes with an insulation film 31 serving as a mask, to form collector region 34 and whereby a base region 32 results above the surface of the out-diffused region 29' and is isolated from the epitaxial layer 30 and the substrate 11 by the collector region 34, the out-diffusion region 25' and buried layers 25 and 29. Simultaneously, the emitter region 33 is formed within the base region 32 as shown in FIG. 3E.

Process for forming a bipolar-type transistor within the epitaxial layer have been described, above, referring to FIGS. 2 and 3, in which an epitaxial layer is grown over a P-type substrate 11. Similarly, diodes and resistors can be formed within the common epitaxial layer by resorting to the known techniques. While it has been difficult with conventional methods to incorporate a bipolar transistor and a junction-type field effect transistor in a common substrate, the above-described methods of this invention makes such an incorporation possible with ease as described below.

Figure 4A:
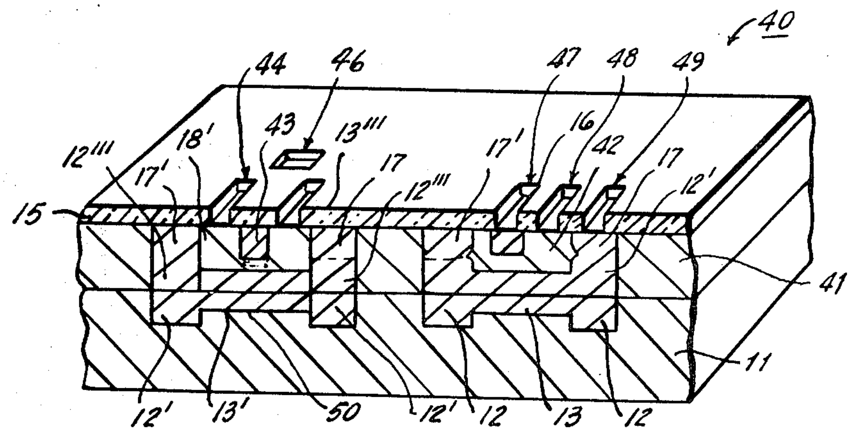
FIGS. 4A and 4B show perspective and plan views of another embodiment of this invention.
Figure 4B:
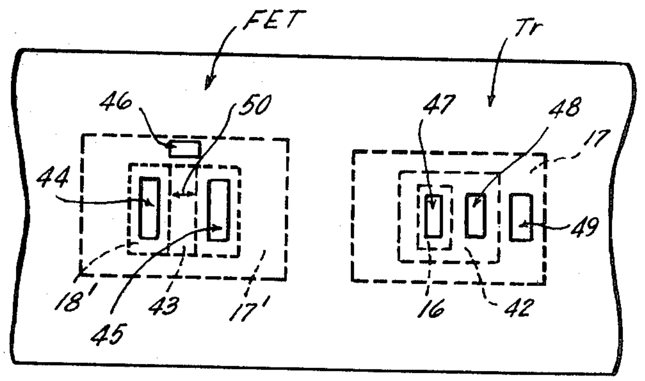

In FIGS. 4A and 4B, another embodiment of this invention is shown wherein an integrated circuit 40 has a junction-type field effect transistor and a bipolar transistor within a common epitaxial wafer 41. The junction-type field effect transistor is formed in the following manner. Buried layers 12→12' and 13→13' of the same conductive-type impurities but having different diffusion speed are formed as previously shown in FIGS. 2D or 3D. On these buried layers, an epitaxial layer 41 including impurities of $4\times10^{17}/cm^3$ boron is formed by the epitaxial growth technique. An oxide film is formed on the surface of this epitaxial layer 41, with openings formed by a photoetching process to allow the N-type impurities to be diffused therethrough. Then, the N-type region 17→17' is diffused to link with the N-type out-diffused region 12'→12''' extending from the buried layer 12→12'. As already explained, diffusion the speed of the 12—12' region faster than that of the other buried layer 13→13'. The gate region 43 is formed simultaneously and extends to a depth comparable to the N-type region 17–17'. Photoetching is then applied to the insulation film 15 which covers the surface of the epitaxial layer, so that the aperture portions 44, 45 and 46 may be formed for leading out the drain electrode, source electrode and gate electrode for the P-channel junction-type field effect transistor (FET). An NPN bipolar transistor (Tr) may be provided in the following manner. N-type impurities are diffused into the emitter region 16 and collector region 17'→17, as already explained and aperture portions 47, 48 and 49 are then formed on the insulation film 15. As is shown, the apertures 47, 48, and 49 are for forming the lead-out electrodes for emitter, base, and collector, respectively.

The widths of the base region 42 of the bipolar transistor and of the channel region 50 of the field effect transistor are designed so that characteristics can be obtained by changing the surface impurity concentrations of the respective buried layers 13 and 13'. In this embodiment, the gap between the gate region 43 and the N-type region 13'→13''' serving as the under gate is about 1 micron. The characteristics of the field effect transistor can be changed by changing the width of the channel region 50 disposed beneath the gate region 43. Since the width of the channel region 50 is equal to the length of the conductive channel of the field effect transistor, it can be decreased to the limit of diffusion accuracy without substantial regard to the aperture portion 46 formed for lead-out of the gate electrode. Therefore, it is possible to fabricate a field effect transistor having a fairly high mutual conductance.

The characteristics of the bipolar transistor can be considerably changed in an arbitrary manner by diffusing P-type impurities into the base region 42 from the upper surface.

As can be seen from the foregoing description, the present structure makes it possible to incorporate a field effect transistor with low noise and high input impedance, and a bipolar transistor, into a common substrate thus facilitating cascade connection of the FET and the bipolar transistor.

While some embodiments of the invention have been explained in detail, it is to be understood that various modifications may be made thereof, for example, arbitrary conductivity-type regions may be disposed and impurity density may be changed if necessary, and that description has been given by way of example and not as a limitation to the scope of the invention.

We claim:

1. A semiconductor integrated circuit device comprising:

a semiconductor substrate of a first conductivity type; and a plurality of individual semiconductor devices formed on said substrate, each of said devices having:

first and second regions of opposite conductivity-types formed within a major surface of said substrate, said second region surrounding said first region on said major surface, and the impurities diffused within said second region having a higher diffusion speed than those of said first region;

an epitaxial layer of said first conductivity-type formed on said major surface covering said regions allowing the impurities of said first and second regions to be out-diffused thereinto;

a third region of the opposite conductivity-type formed by diffusion of impurities from the surface of said epitaxial layer to contact said out-diffused second region and thereby form a substantially uniform region of said opposite conductivity-type;

a fourth region formed from that part of said epitaxial layer which is surrounded by said substantially uniform region and said first region and thus separate from the rest of said epitaxial layer; and metal wiring layers selectively formed over said epitaxial layer in ohmic contact respectively with desired regions.

2. The method of manufacturing a semiconductor integrated circuit device comprising the steps of:

diffusing into a substrate of one conductivity-type impurities of the opposite conductivity-type, said impurities forming a buried layer with two distinct regions, each region having a different diffusion speed, the region of faster diffusion speed impurities surrounding that of the slower diffusion speed impurities;

epitaxially growing a layer of one conductivity type over said substrate; allowing said impurities to be out-diffused at their respective diffusion speeds into said epitaxial layer;

diffusing an impurity of the opposite conductivity-type from a location on the surface of said epitaxial layer so as to join with the region of similar conductivity formed by the out-diffused buried layer of faster diffusion speed in order to enclose a region of said epitaxial layer separate from the rest of said epitaxial layer.

3. The semiconductor integrated circuit device of claim 1 having a fifth region formed by diffusion from the surface of said fourth region and surrounded thereby.

4. The method of claim 2 including the step of diffusing an impurity of the opposite conductivity-type from a location on the surface of said epitaxial layer so as to form a region surrounded by said enclosed region of said epitaxial layer.

5. The method of claim 4 in which the steps of diffusing impurities of the opposite conductivity-type from the surface of the epitaxial layer are carried out simultaneously.

6. The method of claim 2 wherein the two regions of different diffusion speed in the buried layer are formed by providing two different impurities of the opposite conductivity-type.

7. The method of claim 4 wherein the two regions of different diffusion speed in the buried layer are formed by providing two different impurities of the opposite conductivity-type.

8. The method of claim 2 wherein the two regions of different diffusion speed in the buried layer are formed by providing different concentration of the same impurity.

9. The method of claim 4 wherein the two regions of different diffusion speed in the buried layer are formed by providing different concentration of the same impurity.

10. The method of claim 8 wherein the two regions of different diffusion speeds are formed through the following steps:

forming an oxide film on a chosen surface of the substrate;

etching said film to expose a desired portion of said substrate;

diffusing an impurity of the opposite conductivity-type into said substrate through said etched film in order to form a buried layer;

forming an oxide film on the chosen surface;

selectively etching said film to expose a part of said layer surrounded by an unexposed part so as to decrease the surface impurity concentration of said surrounded part of the buried layer and thus provide the two regions of different diffusion speeds.

11. The method of claim 4 wherein the two regions of different diffusion speeds are formed through the following steps:

forming an oxide film on a chosen surface of the substrate;

etching said film to expose a desired portion of said substrate;

diffusing an impurity of the opposite conductivity-type into said substrate through said etched film in order to form a buried layer;

forming an oxide film on the chosen surface;

selectively etching said film to expose a part of said layer surrounded by an unexposed part so as to decrease the surface impurity concentration of said surrounded part of the buried layer and thus provide the two regions of different diffusion speeds.